(12) United States Patent
Hon et al.

(10) Patent No.: US 7,001,824 B2
(45) Date of Patent: Feb. 21, 2006

(54) GALLIUM NITRIDE VERTICAL LIGHT EMITTING DIODE STRUCTURE AND METHOD OF SEPARATING A SUBSTRATE AND A THIN FILM IN THE STRUCTURE

(75) Inventors: Schang-Jing Hon, Pa Te (TW); Mu-Jen Lai, Chungli (TW)

(73) Assignee: Supernova Optoelectronics Corporation, Taoyuan (TW)

( * ) Notice: Subject to any disclaimer, the term of this patent is extended or adjusted under 35 U.S.C. 154(b) by 0 days.

(21) Appl. No.: 10/781,769

(22) Filed: Feb. 20, 2004

(65) Prior Publication Data

US 2005/0186783 A1    Aug. 25, 2005

(51) Int. Cl.
*H01L 21/30* (2006.01)
*H01L 21/46* (2006.01)
(52) U.S. Cl. .......................... 438/455; 438/105; 438/30
(58) Field of Classification Search ................ 438/455, 438/30, 33, 46, 47, 48, 35, 77, 94, 141, 191, 438/105, 535, 460, 458, 795, 956
See application file for complete search history.

(56) References Cited

U.S. PATENT DOCUMENTS

| | | | |
|---|---|---|---|
| 5,281,830 A * | 1/1994 | Kotaki et al. | 257/86 |
| 5,952,680 A * | 9/1999 | Strite | 257/88 |
| 6,562,648 B1 * | 5/2003 | Wong et al. | 438/46 |
| 6,611,003 B1 * | 8/2003 | Hatakoshi et al. | 257/98 |
| 6,627,921 B1 * | 9/2003 | Wong et al. | 257/79 |
| 2003/0150843 A1 | 8/2003 | Doi et al. | |

* cited by examiner

*Primary Examiner*—David Nhu
(74) *Attorney, Agent, or Firm*—Rosenberg, Klein & Lee

(57) ABSTRACT

A gallium nitride (GaN) vertical light emitting diode (LED) structure and a method of separating a substrate and a thin film thereon in the GaN vertical LED are described. The structure has a metal reflective layer for reflecting light. The method provides a laser array over the substrate. A laser light emitted by the laser array is least partially be transparent to the substrate and its energy may be absorbed by the thin film. The thin film is irradiated through the substrate. The substrate is then separated from the thin film.

7 Claims, 5 Drawing Sheets

100
GALLIUM NITRIDE VERTICAL LIGHT EMITTING DIODE STRUCTURE AND METHOD OF SEPARATING A SUBSTRATE AND A THIN FILM IN THE STRUCTURE

BACKGROUND OF THE INVENTION

1. Field of Invention

The present invention relates to a gallium nitride (GaN)-based light-emitting diode (LED), and particularly to a method of separating a substrate and a thin film thereon in a vertical GaN-based LED structure.

2. Related Art

Semiconductor light-emitting diodes (LEDs) have developed for several decades and luminous efficiency thereof has played a key role in the further application of LEDs in lighting facilities generally used in daily life. Therefore, the development and research of LEDs have been focused on improvement of luminous efficiency. However, heat issue has been a primary limitation on the luminous efficiency of the LEDs, since LEDs do not work normally without appropriately removing heat generated from the LEDs. Therefore, efforts of development and research of LEDs are actually paid to improvement of luminous efficiency and evacuation of heat.

Numerous methods of heat evacuation from an LED exist. For example, a metal-based circuit substrate replaces a poor heat-conductive printed circuit board (PCB), and thus the heat around the LED may be removed by virtue of the metal. On the other hand, evacuation of heat inside the LED structure may be also further improved. For example, sapphire is a suitable bulk material for growth of GaN-based layer in an LED, but it is a poor heat-conductive non-electricity conductive material. Consequently, sapphire is generally first used as a substrate for growth of GaN-based material and then is separated from the LED structure. Next, the LED structure with the sapphire substrate removed is bonded with a better heat-conductive substrate, which is illustrated in FIG. 1A and FIG. 1B.

Since the sapphire substrate is used only for growth of thin film layers and is removed after the thin film layers are formed, the sapphire substrate is termed here "transition substrate". In FIG. 1A, the vertical LED structure 10 is in an unfinished stage. In the figure, a transition substrate 16 is used for growth of thin film layers and the thin film layers comprise an n-type GaN-based layer 15, an active layer 14, a p-type GaN-based layer 13 and a metal substrate 11. Additionally, a p-type electrode 17 is formed on the metal substrate 11. Since the transition substrate 16 is provided as a support for subsequent processes, the transition substrate 16 is removed after completion of the vertical LED as shown in FIG. 1B. In FIG. 1B, the vertical LED structure 10 has been rotated 180 degrees as compared to the structure in FIG. 1A. The transition substrate 16' is first removed and then an n-type electrode 18' is formed over the n-type GaN-based layer 15' and the vertical LED structure 10' is manufactured successfully.

Referring again to FIG. 1B, the formed vertical LED structure 10' is thus named because the thin film layers in the structure has no lateral structure. The vertical structure 10' not only improves evacuation of heat but also has a larger light-emitting area since its two electrodes are not disposed along the lateral direction of the LED structure and will not block irradiation of generated light. Reference is made to FIG. 1C, which illustrates the vertical LED structure 10" with the transition substrate removed in FIG. 1B. A part of the light generated by the active layer 14" is transmitted towards the p-type GaN-based layer 13" and another part of the light generated by the active layer 14" is transmitted towards the n-type GaN-based layer 15", indicated by the arrows. If the side near the n-type electrode 18" is the desired light output side, the light portion towards the p-type electrode 17" is wasted.

Several technologies with regard to separation of a transition substrate and a thin film thereon in a vertical structure have been set forth. For example, a weak structure is fabricated between the transition substrate and the p-type semiconductor material or n-type semiconductor material. When a force is applied, the transition substrate is separated from the p-type semiconductor material or n-type semiconductor material. As an alternative example, a laser light is provided to separate the transition substrate and the thin film thereon. Since the thin film on the transition substrate absorbs the energy of the laser light, the side of the thin film adjacent to the transition substrate may be melted and separated from the transition substrate. The published patent application US20030150843 has disclosed the similar technology. Referring to FIG. 2 in the patent application, a line form laser light 23 scans a thin film 21 on a transition substrate 22 so that the interface 25 of the thin film 21 with the transition substrate 22 absorbs the energy of the laser light 23, the interface 25 adjacent to the transition substrate is melted and separated from the transition substrate 22. In scanning, the transition substrate 22 and the thin film 21 are moved together in the direction as shown. In the figure, S represents a scanning area at a scan, M represents a scanning width, and t represents a thickness of the thin film 21, where the M value is approximately equal to or smaller than the t value.

However, the above patent application still has drawbacks. For example, after the line-form light scans the thin film, melting occurs to varying degrees over the total surface of the thin film. Therefore, the transition substrate 22 and the thin film 21 may not be uniformly stripped. Further, line-form laser light may lead to a thermal stress issue, which also adversely affects separation of the transition substrate and the thin film, and the thin film is apt to crack.

In view of the shortcomings of the prior GaN-based vertical LED structure and method therefor, it is necessary to provide a GaN-based LED structure that does not waste generated light and a method of separating a substrate from a thin film thereon.

SUMMARY OF THE INVENTION

The present invention is primarily aimed to reduce non-uniform stress and melting problems resulting from separation of a transition substrate and a thin film thereon in manufacturing a vertical light emitting diode (LED) structure. To achieve the above purpose, a first aspect of the present invention uses a laser array as an energy source for separation of the transition substrate and the thin film thereon, in which the range the laser array may illuminate is approximately the same as the area of the thin film and the transition substrate.

When the laser array is powered, the laser energy is at the same time absorbed by the total thin film. Since the energy absorbed over the thin film is uniform and melting occurs substantially uniformly, the thin film separates from the transition substrate without the problem resulting from thermal stress.

In addition, since the thin film is irradiated by the laser array for a much short time, the process time is shortened.

A second aspect of the present invention is a GaN-based vertical LED structure with improved luminous efficiency, where a metal reflective layer is provided to reflect a light to obtain larger light output efficiency.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, where.

DETAILED DESCRIPTION OF THE INVENTION

The present invention provides an effective manufacturing method for a vertical light-emitting diode (LED) structure. Using the method, a transition substrate and a thin film thereon in a vertical LED structure may be more uniformly separated and the process time may be shortened.

Figure 1A:
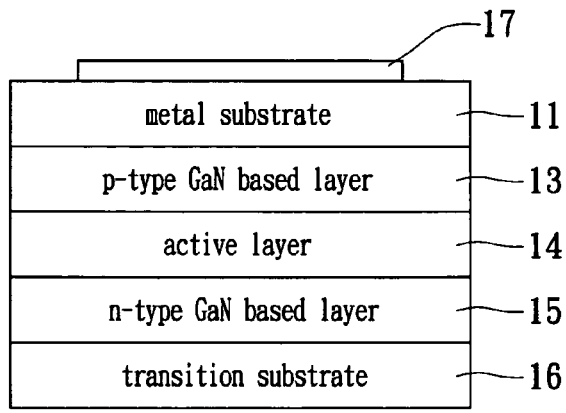
FIGS. 1A and 1B jointly illustrate a prior technology to separate a transition substrate from a thin film thereon.
Figure 1B:
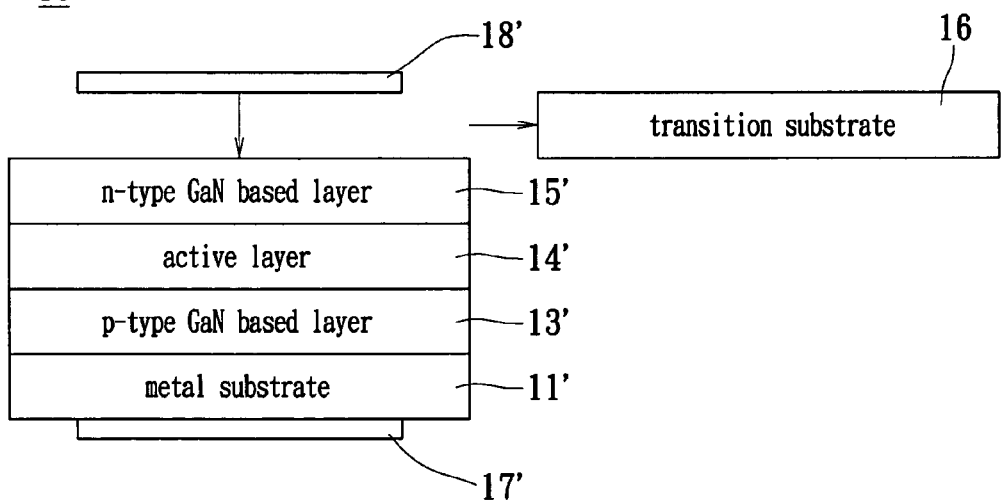
Figure 1C:
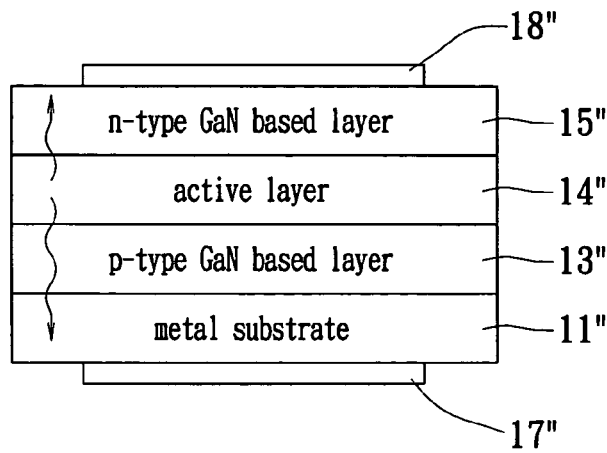
FIG. 1C illustrates the thin film structure separated from the transition substrate according to FIGS. 1A and 1B.
Figure 2:
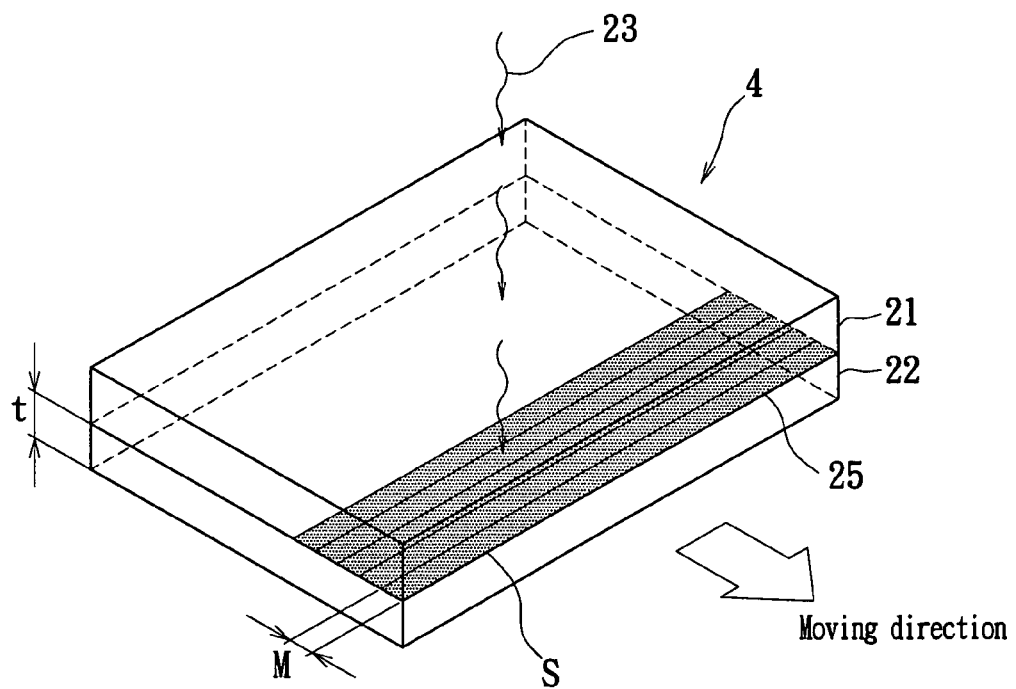
FIG. 2 is an illustration of a process of a prior separation of a transition substrate and a thin film thereon.
Figure 3:
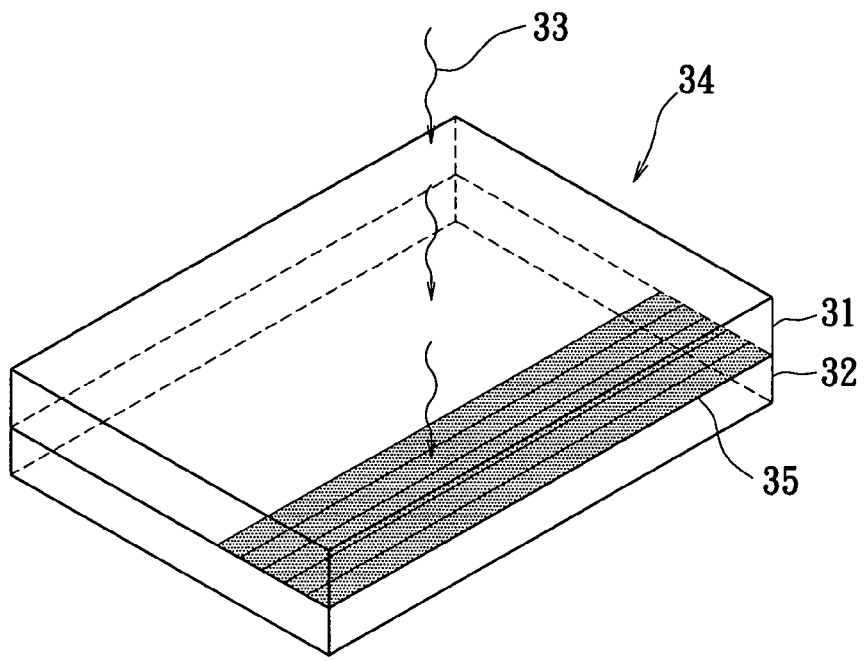
FIG. 3 illustrates a process embodiment of separating a substrate and a thin film thereon according to the present invention.

Reference is made to FIG. 3. In FIG. 3, a thin film 32 and a transition substrate 31 of the structure 34 are bonded together, and intended to be separated from each other. In separation, a laser array 33 is provided over the transition substrate 31 and irradiates energy to separate the thin film 32 from the transition substrate 31. Although the illustrated laser array 33 is a 1×3 array, it is to be noted that any dimension of laser array suitable for irradiating the interface 35 of the thin film 32 with the transition substrate 31 may be used properly, such as 1×n and 3×n arrays.

When the laser array 33 is turned on, the laser array 33 irradiates energy. Since the purpose of the laser array 33 is to melt the interface between the thin film 32 and the transition substrate 31, the wavelength of the laser array 33 is selected so that the laser energy may penetrate the transition substrate and be absorbed by the interface 35. For example, if the thin film 32 is an n-type GaN-based layer, the selected wavelength is about 327 nm.

Figure 4:
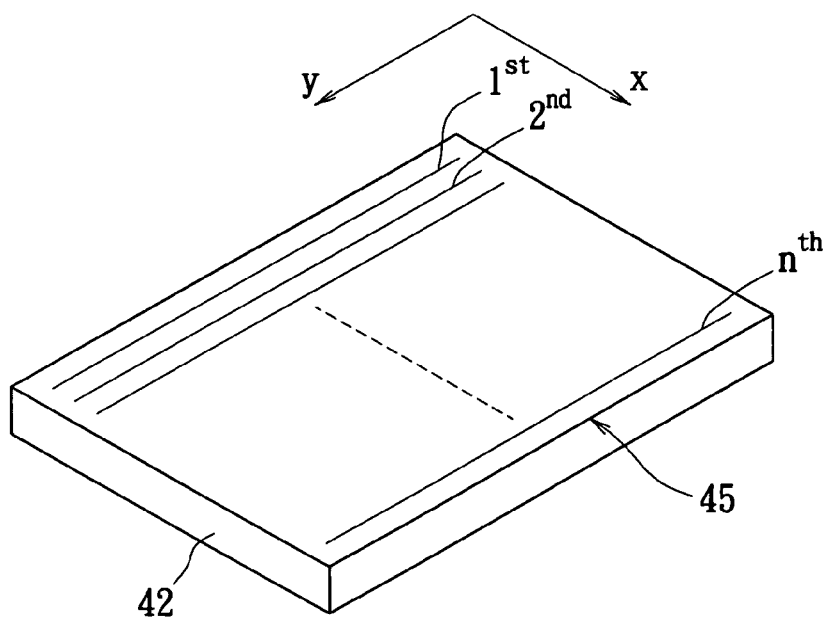
FIG. 4 illustrates an energy absorption distributed pattern over the thin film according to the present invention.

In an embodiment, a grating may be placed between the transition substrate 31 and the laser array 33 to make the laser light into several stripe-form lights. When the laser light penetrates the transition substrate 31, the energy absorption pattern over the thin film 32 should be maintained as that shown in FIG. 4. In FIG. 4, over the interface 45 of the thin film 42 is a plurality of energy absorption portions $1^{st}$, $2^{nd}$ ..., $n^{th}$, which are formed by slits in the grating over the thin film 42. For the energy absorption portions $1^{st}$, $2^{nd}$ ..., $n^{th}$, each is closely adjacent to the neighboring one and each has approximately the same energy intensity absorbed.

It is also to be noted that the grating may be replaced by other optical elements as long as the laser light may be uniformly irradiated over the thin film 42.

Figure 5:
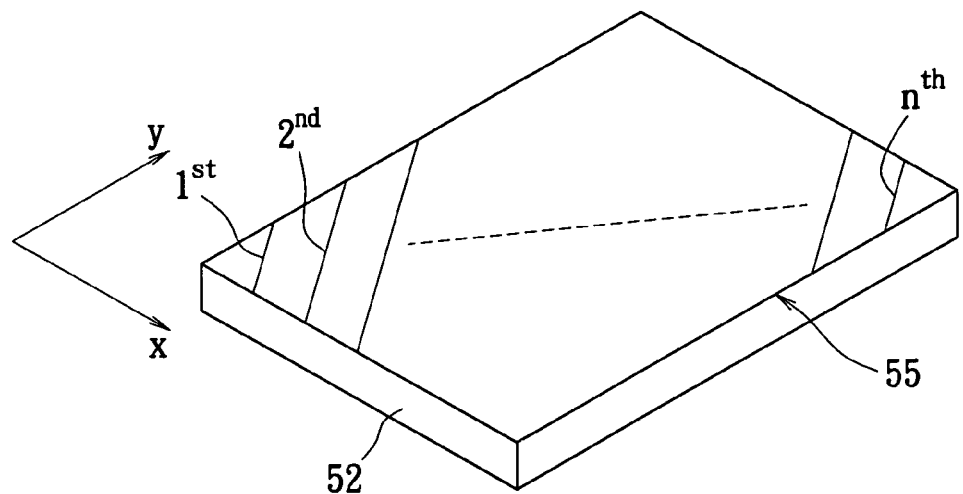
FIG. 5 illustrates another energy absorption distributed pattern over the thin film according to the present invention.

Reference is made to FIG. 5, which illustrates another energy absorption intensity distribution pattern embodiment. The pattern shown in FIG. 5 may also achieve a uniform separation of the thin film 52 from the interface 55 between the substrate and the thin film 52, and any other pattern embodiment that may be uniformly absorbed by the thin film 52 may be otherwise utilized.

Figure 6:
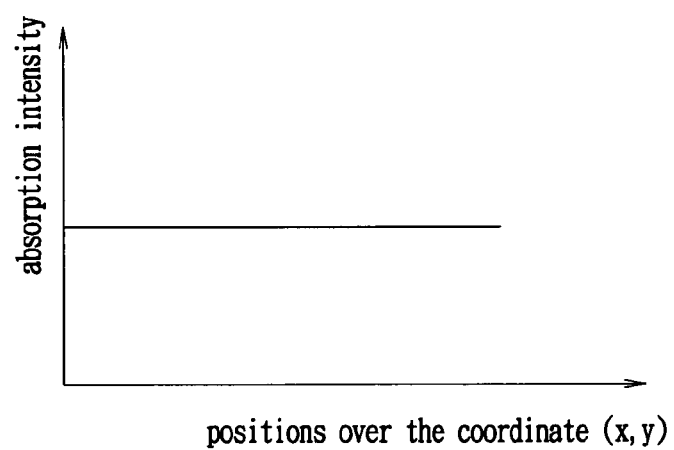
FIG. 6 illustrates an ideal energy absorption distributed pattern over the thin film according to the present invention.

To achieve uniform distribution pattern of energy absorbed, the laser light employed should be additionally modified, such as making the laser light go through a grating as described above. Besides, other characteristics of the last light may be adjusted to acquire more uniform distribution of energy absorbed, such as adjusting a focus of the laser light. The purpose of the adjusted laser energy distribution is to make the distribution pattern very similar to that shown in FIG. 6, which shows that any points over the (X,Y) coordinate on the thin film have totally the same energy absorption intensity.

Figure 7:
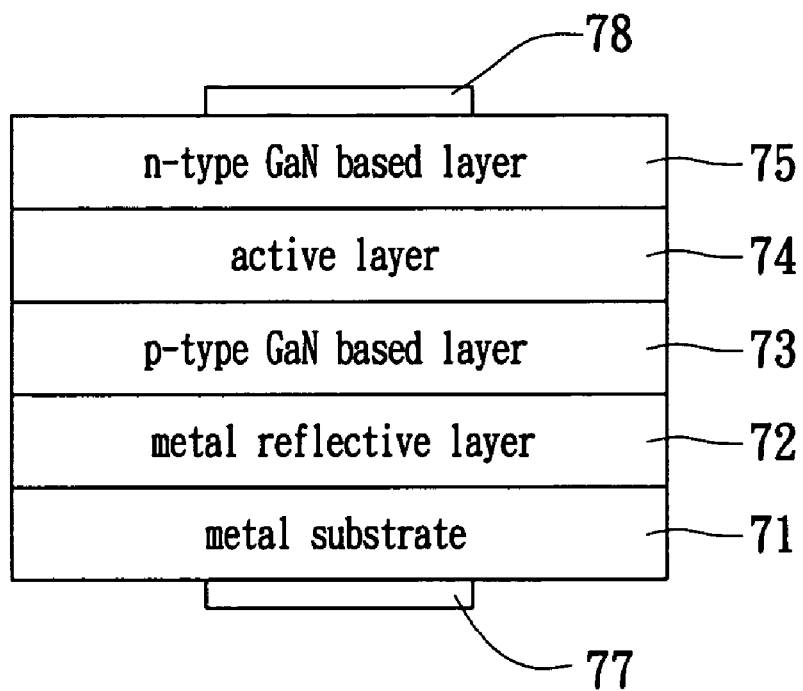
FIG. 7 illustrates a GaN-based vertical light emitting diode (LED) structure.

FIG. 7 shows a GaN-based vertical LED structure 70 according to the present invention, where a P-type electrode 77, an N-type electrode 78 and a metal reflective layer 72 are provided therein. When the active layer 74 emits a light, a portion of the light goes towards the p-type GaN-based layer 73. The portion of the light is successively reflected by the metal reflective layer 72 to increase the light intensity towards the n-type GaN-based layer 75. The n-type and p-type GaN-based layers 75,73 in the structure 70 may be exchanged in position, which forms another embodiment (not shown) of the present invention.

As far as the material of the metal reflective layer 72 is concerned, it may be selected as one with a better match with the metal substrate 71 and with a better reflective ability. For example, copper and tungsten alloy (CuW) may be used as the metal substrate, and silver (Ag), aluminum (Al) or rhodium (Rh) may be at the time chosen as the metal reflector 72.

The invention has been described as above, and it will be obvious that the above embodiments may be varied in many ways that are apparent to those skilled in the art. For example, the dimension of the laser array may be changed, the energy absorption distribution pattern may be varied, the grating employed may be replaced by other optical elements and the combination of the laser light and the thin film may also be changed. Such variations are not to be regarded as a departure from the spirit and scope of the invention, and all such modifications as would be obvious to one skilled in the art are intended to be included within the scope of the following claims.

What is claimed is:

1. A method of separating a sapphire substrate from a thin film overlaying a top side of said sapphire substrate, comprising the steps of:

providing a laser array, said laser array emitting a plurality of laser light beams toward a back side of said sapphire substrate for absorption by said thin film;

irradiating said thin film with said plurality of light beams from said laser array through said sapphire substrate; and separating said sapphire substrate and said thin film.

2. The method according to claim 1, wherein each of said plurality of laser light beams has a wavelength of about 327 nm.

3. The method according to claim 1, wherein the step of irradiating said thin film is irradiating on an interface of said thin film with said sapphire substrate.

4. The method according to claim 1, wherein the step of providing a laser array includes the step of providing said laser array having a predetermined dimension to illuminate an area equivalent to an area of said sapphire substrate and said thin film.

5. A method of separating a substrate from a thin film overlaying a top side of said substrate, comprising the steps of:

providing a laser array, said laser array emitting a plurality of laser light beams toward a back side of said substrate and said substrate being substantially transparent to said plurality of laser light beams for absorption of said plurality of laser light beams by said thin film;

irradiating said thin film with said laser array through said substrate; and separating said substrate and said thin film.

6. The method according to claim 5, wherein the step of irradiating said thin film includes the step of providing an optical grating between said laser array and said substrate and irradiating said thin film through said grating and said substrate to provide a uniform striped pattern of irradiation.

7. The method according to claim 5, wherein the step of providing a laser array includes the step of providing said laser array having a predetermined dimension to illuminate an area eqivalent to an area of said substrate and said thin film.

* * * * *